(12) United States Patent
Choi (10) Patent No.: US 7,933,157 B2
(45) Date of Patent: Apr. 26, 2011

(54) APPARATUS FOR GENERATING PUMPING VOLTAGE

(75) Inventor: Young-Kyoung Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 187 days.

(21) Appl. No.: 12/347,143

(22) Filed: Dec. 31, 2008

(65) Prior Publication Data

US 2010/0061163 A1    Mar. 11, 2010

(30) Foreign Application Priority Data

Sep. 9, 2008  (KR) .................. 10-2008-0088663

(51) Int. Cl.
*G11C 7/00* (2006.01)
(52) U.S. Cl. .............................. 365/189.09; 365/230.03
(58) Field of Classification Search ......... 365/189.09 O, 365/226, 230.03 X, 189.09, 230.03
See application file for complete search history.

(56) References Cited

U.S. PATENT DOCUMENTS

| 5,781,494 A | * | 7/1998 | Bae et al. ................. 365/230.03 |
| 5,889,664 A | | 3/1999 | Oh |
| 6,577,535 B2 | * | 6/2003 | Pasternak ................. 365/185.11 |
| 6,654,296 B2 | | 11/2003 | Jang et al. |

FOREIGN PATENT DOCUMENTS

| KR | 100124049 | 9/1997 |
| KR | 1020060040903 | 5/2006 |

* cited by examiner

*Primary Examiner* — Van Thu Nguyen
(74) *Attorney, Agent, or Firm* — Baker & McKenzie LLP (57) ABSTRACT

An apparatus for generating pumping voltage of a multiple Chip Select (CS) mode semiconductor memory apparatus includes a high speed pumping control unit configured to produce a pumping enable signal regardless of the level of a pumping voltage to actuate the pumping unit when a plurality of banks of the semiconductor apparatus operated by different CS signals are continuously actuated.

14 Claims, 11 Drawing Sheets

APPARATUS FOR GENERATING PUMPING VOLTAGE

CROSS-REFERENCES TO RELATED APPLICATION

The present application claims priority under 35 U.S.C. §119(a) to Korean application number 10-2008-0088663, filed on Sep. 9, 2008, in the Korean Intellectual Property Office, which is incorporated herein by reference in its entirety as if set forth in full.

BACKGROUND

1. Technical Field

The embodiments disclosed herein relate to an apparatus for generating pumping voltage, and more particularly, to an apparatus for generating pumping voltage capable of high speed bank actuation for a semiconductor memory apparatus operating in a multi-CS (Chip Select) mode.

2. Related Art

Generally, in a semiconductor memory apparatus, pins are commonly required to operate DRAM devices, wherein a Chip Select (CS) pin determines whether a specific DRAM is operated or not. For example, when the CS pin is enabled at a low level, the DRAM devices are functional, and when the CS pin is at a high level, the DRAM device are not functional regardless of the other input pins.

Currently, for convenience, a semiconductor memory apparatus is provided with two CS pins, thereby the one semiconductor memory apparatus may be used as two semiconductor memory apparatuses. For example, in 1 Gb DRAM device, if two different CS pins control the operations of the 512 Mb cell, the effect is of two 512 Mb DRAMs being used. Here, when two cells that are designed in one DRAM device are operated as an independent DRAM, an actuation interval between the cells is reduced. For example, when a first cell having bank0 and bank1 is controlled by a CS signal 'CS0' and a second cell having bank2 and bank3 is controlled by a CS signal 'CS1', an actuation interval tRRD between bank0 and bank1 is controlled by the same CS signal 'CS0' at about 10 ns. However, it is required that the banks controlled by different CS signals 'CS1' are operated as independent banks. Accordingly, an actuation interval tRRD_RR between the banks controlled by different CS signals has a very small value as compared to tRRD, and in general, it is about 1 ns.

As described above, if the bank actuation interval is reduced, a temporary AC level drop of internal power used in the semiconductor memory apparatus is rapidly increased. Moreover, in the case of pumping voltage vpp that requires high current and much time for actuation, the drop amount is increased.

Figure 1:
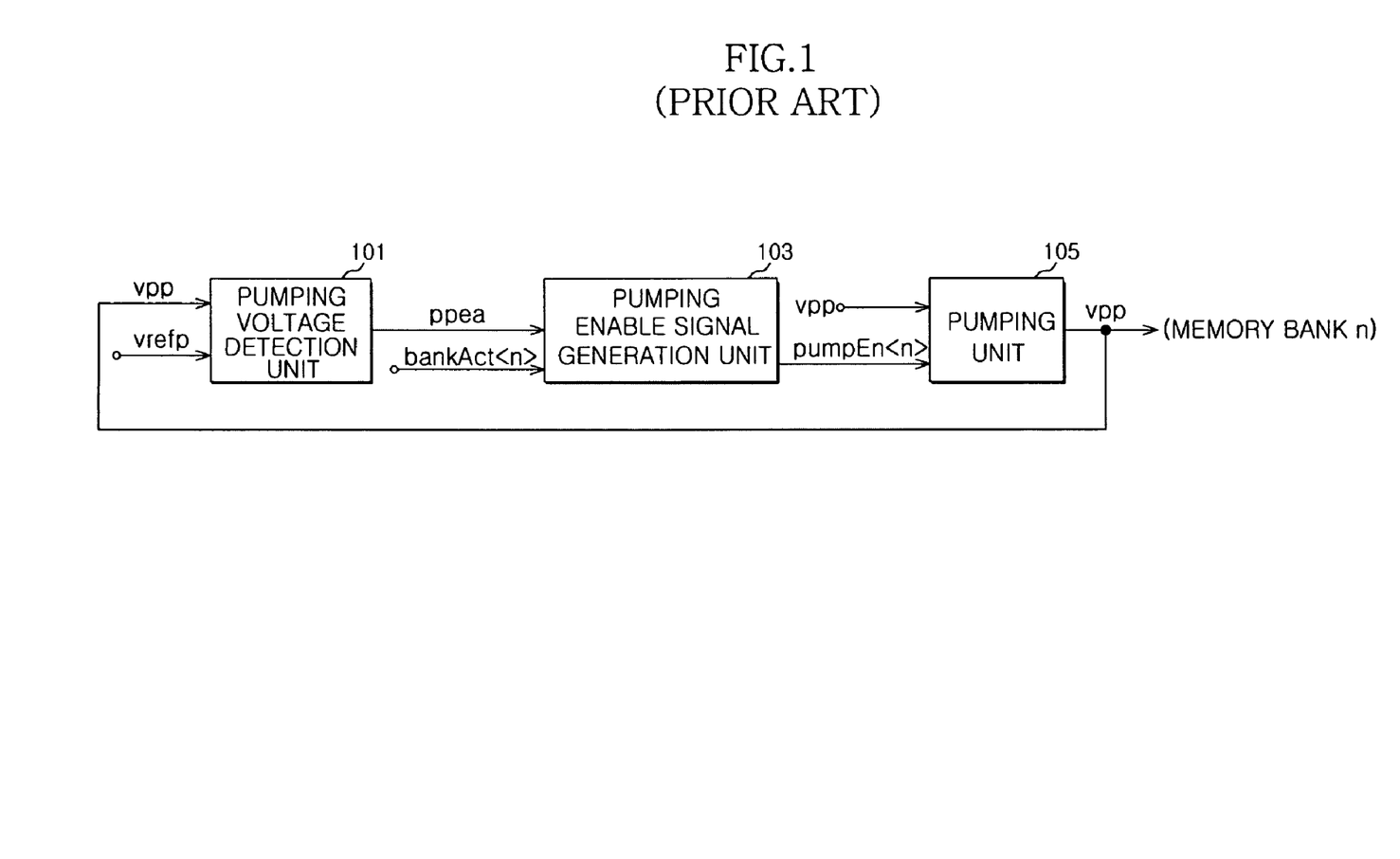
FIG. 1 is a schematic diagram of a conventional apparatus for generating pumping voltage.

FIG. 1 is a schematic diagram of a conventional apparatus for generating pumping voltage. In FIG. 1, the apparatus provides pumping voltage to the bank n. The apparatus includes a pumping voltage detection unit 101 that receives the pumping voltage vpp and the reference voltage vrefp to output a pumping control signal 'ppea' when the pumping voltage is lower than the reference voltage. In addition, the apparatus includes a pumping enable signal generation unit 103 that receives the pumping control signal 'ppea' and a bank active signal 'bankAct<n>' to output a pumping enable signal 'pumpEn<n>' when the bank is actuated, and a pumping unit 105 that pumps voltage to output the pumping voltage response to the pumping enable signal 'pumpEn<n>'.

Figure 2:
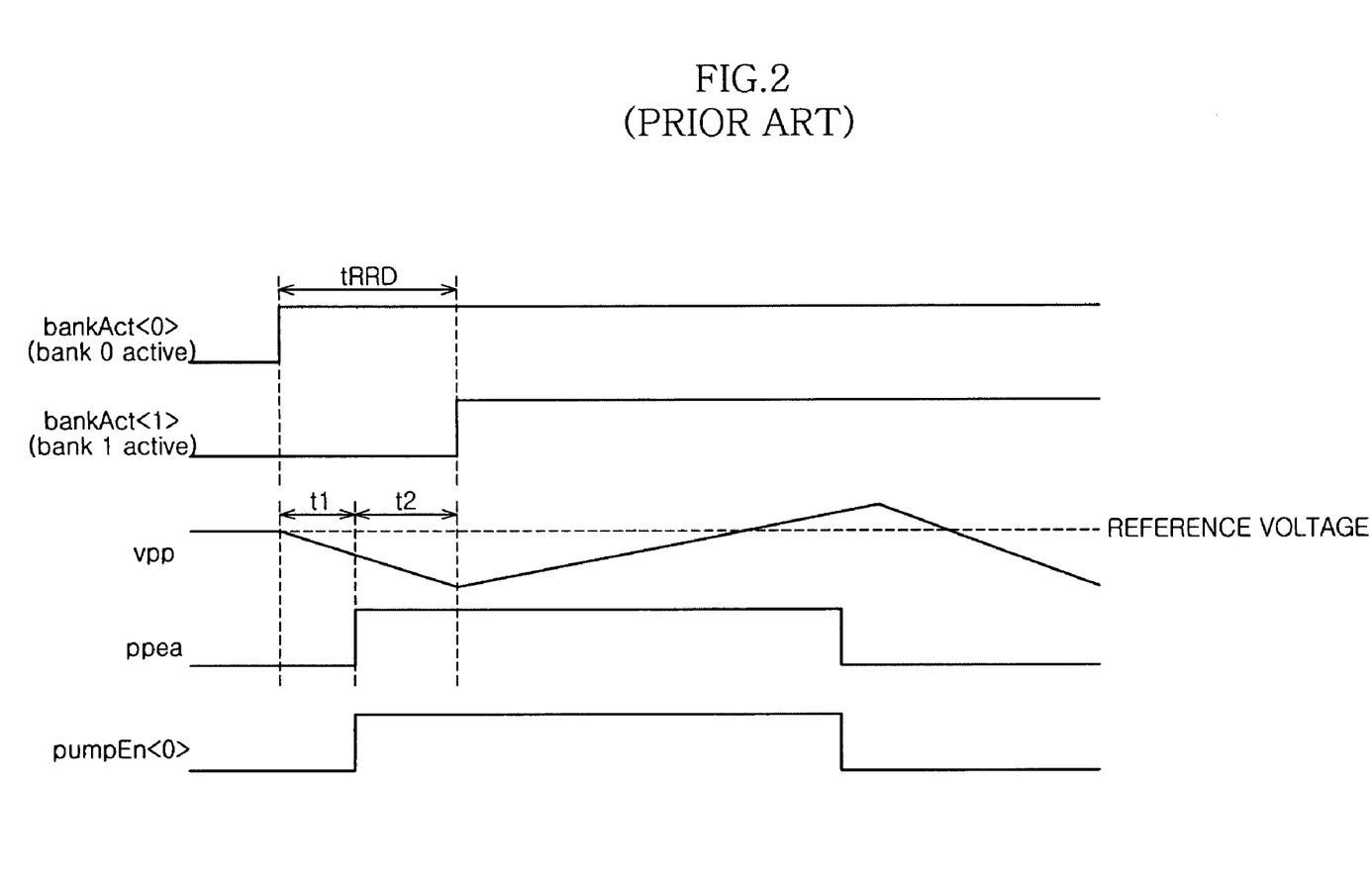
FIG. 2 is a timing diagram illustrating an operation of a 1 CS mode of the apparatus of FIG. 1.

FIG. 2 is a timing diagram illustrating an operation of a 1 CS mode of the apparatus of FIG. 1. In FIG. 2, the timing diagram illustrates operation of a single chip select mode 1CSmode of the apparatus for generating pumping voltage shown in FIG. 1.

According to the enabling of the bank active signal 'bankAct<0>' in respects to bank0, the pumping voltage vpp is reduced, and if the pumping voltage vpp is lower than the reference voltage vrefp, the pumping control signal 'ppea' is enabled. However, in order for the pumping voltage detection unit 101 to detect a voltage level and output it, a predetermined response time is required. Thus, after the pumping voltage vpp becomes lower than the reference voltage vrefp and when a predetermined time t1 is passed, the pumping control signal 'ppea' is enabled.

In addition, even after the pumping enable signal 'pumpEn<0>' is enabled by the pumping control signal 'ppea' and the pumping unit 105 starts to operate, a time t2 until the pumping voltage vpp is boosted is required. Accordingly, after the bank is activated, it takes a time of t1+t2 to boost the pumping voltage.

In the 1CS mode of a semiconductor memory device, since an active interval tRRD between the banks is about 10 ns, according to activation of bank0, after the reduced pumping voltage is boosted, i.e., after t1+t2, the bank active signal 'bankAct<1>' with respect to bank1 is enabled, thus the semiconductor memory apparatus is normally operated.

However, in the multi chip select mode 2CS mode of a semiconductor memory device, because the active interval tRRD_RR between the banks controlled by different CS signals is short, the reduction amount of pumping voltage vpp is boosted.

Figure 3:
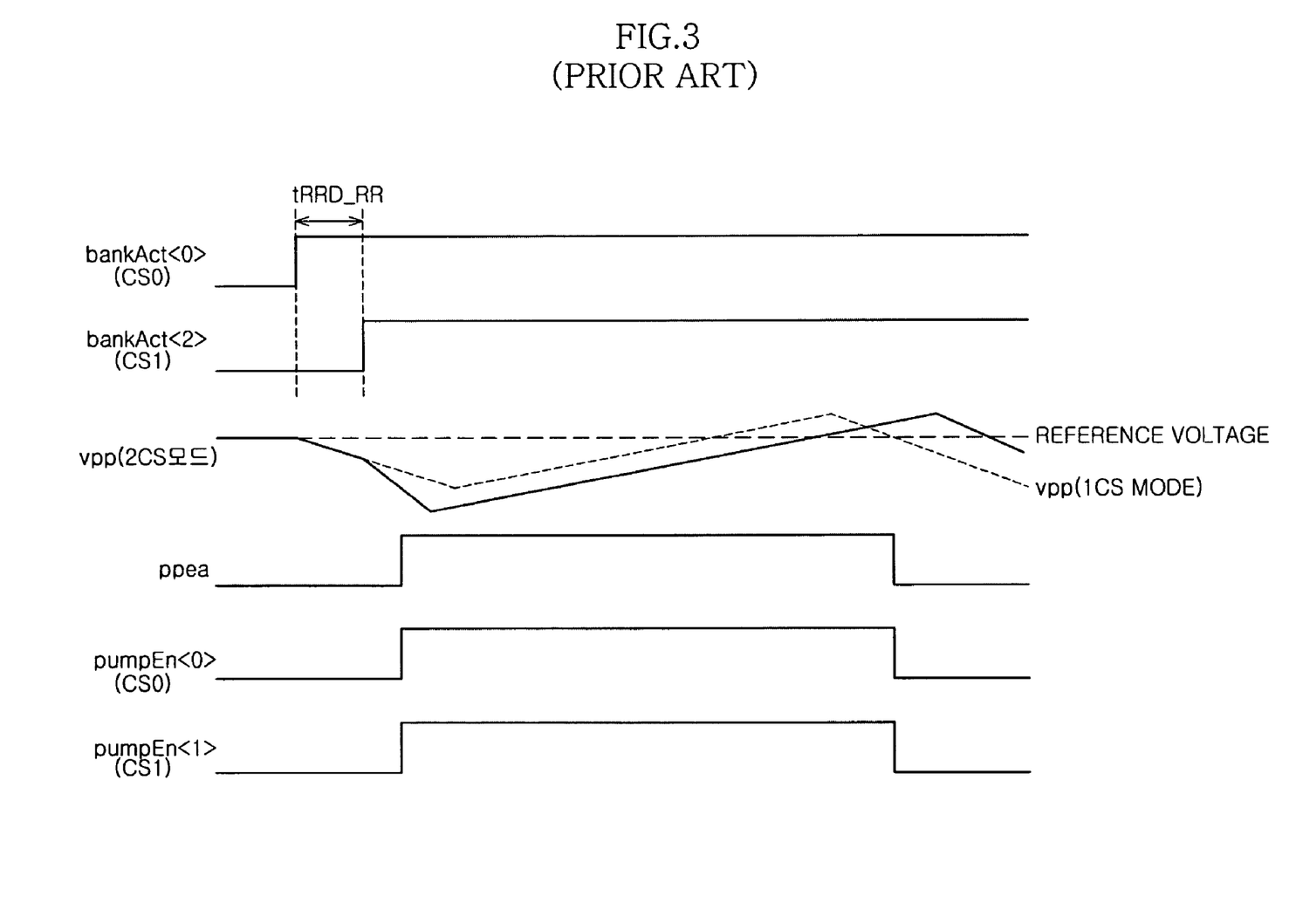
FIG. 3 is a timing diagram illustrating a conventional voltage pumping operation of a 2 CS mode semiconductor memory apparatus.

FIG. 3 is a timing diagram illustrating a conventional voltage pumping operation of a 2CS mode semiconductor memory apparatus. In FIG. 3, the timing diagram illustrates a general voltage pumping operation of a 2CS mode semiconductor memory apparatus.

If the bank active signal 'bankAct0' with respect to bank0 operated by the CS0 signal is enabled, then the pumping voltage vpp is reduced. Subsequently, if the bank active signal 'bankAct<2>' with respect to bank2 operated by the CS1 signal is enabled, the pumping voltage vpp is further reduced. For example, since the actuation interval tRRD_RR between bank0 and bank2 actuated by different CS signals 'CS0' and 'CS1' is about 1 ns, which is relatively short, in the pumping voltage detection unit, while the pumping control signal 'ppea' is output, the pumping voltage vpp is further reduced as compared to the 1CS mode.

In addition, even after the pumping enable signal0 'pumpEn<0>' output by the pumping control signal 'ppea' and the bank active signal 'bankAct<0>' with respect to bank0, and the pumping enable signal1 'pumpEn<1>' output by the pumping control signal 'ppea' and the bank active signal 'bankAct<2>' with respect to bank2 are enabled, since a predetermined time is required in pumping, the pumping voltage vpp is continuously reduced. Accordingly, there are problems in that precise data is not recorded in cells and failure occurs.

SUMMARY

An apparatus for generating pumping voltage capable of boosting pumping voltage at a high speed in a multi CS mode semiconductor memory apparatus is described herein.

In one aspect, an apparatus for generating pumping voltage of a multiple Chip Select (CS) mode semiconductor memory apparatus includes a high speed pumping control unit configured to produce a pumping enable signal regardless of the level of a pumping voltage to actuate the pumping unit when a plurality of banks of the semiconductor apparatus operated by different CS signals are continuously actuated.

In another aspect, an apparatus for generating pumping voltage of a multiple Chip Select (CS) mode semiconductor memory apparatus includes a high speed pumping control unit configured to actuate a pumping unit by enabling a pumping enable signal regardless of the level of pumping voltage to actuate the pumping unit when a plurality of banks of the semiconductor memory apparatus actuated by different CS signals are continuously actuated within a predetermined time and to disable the pumping enable signal when the plurality of banks actuated by different CS signals are delayed for a predetermined time or more and continuously actuated.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

In the following description, a pumping voltage generation apparatus is provided with respect to each bank (bank0~bank3), as an example, a 2CS mode in which CS0 signal controls operation of bank0 and bank1 of a first cell and CS1 signal controls operation of bank2 and bank3 of a second cell will be described.

Figure 4:
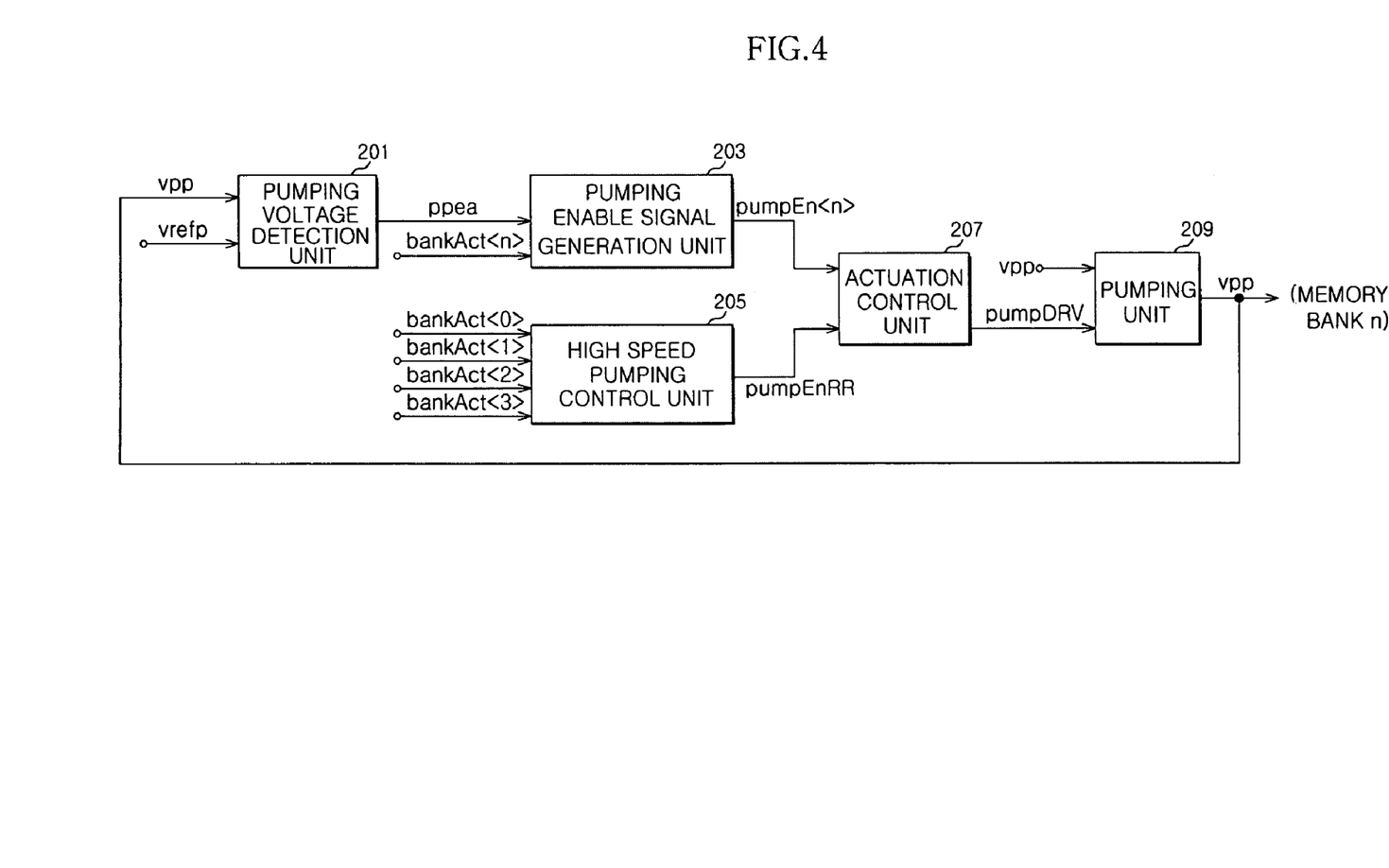
FIG. 4 is a schematic diagram of an exemplary apparatus for generating pumping voltage according to one embodiment.

FIG. 4 is a schematic diagram of an exemplary apparatus for generating pumping voltage according to one embodiment. In FIG. 4, an apparatus for generating pumping voltage can include a pumping voltage detection unit 201, a pumping enable signal generation unit 203, a high speed pumping control unit 205, an actuation control unit 207, and a pumping unit 209.

The pumping voltage detection unit 201 can receive the pumping voltage vpp and a reference voltage vrefp to enable and output a pumping control signal 'ppea' when the pumping voltage is lower than the reference voltage. The pumping enable signal generation unit 203 can receive the pumping control signal 'ppea' and a bank active signal 'bankAct<n>' with respect to a specific bank bankn to output a first pumping enable signal 'pumpEn<n>' when the bank bankn is actuated. The high speed pumping control unit 205 can receive the bank active signals 'bankAct<0>', 'bankAct<1>', 'bankAct<2>', and 'bankAct<3>' with respect to all banks to output a second pumping enable signal 'pumpEnRR' when the bank that is operated by different CS signals is continuously actuated. The actuation control unit 207 can output a pumping actuation signal 'pumpDRV' according to output signal of the pumping enable signal generation unit 203 and output signal of the high speed pumping control unit 205. The pumping unit 209 can pump voltage to output the pumping voltage vpp according to enabling of the pumping actuation signal 'pumpDRV'.

Here, it is preferable that the high speed pumping control unit 205 and the actuation control unit 207 are provided in any one of the apparatuses for generating pumping voltage that provides pumping voltage to each bank.

Figure 5:
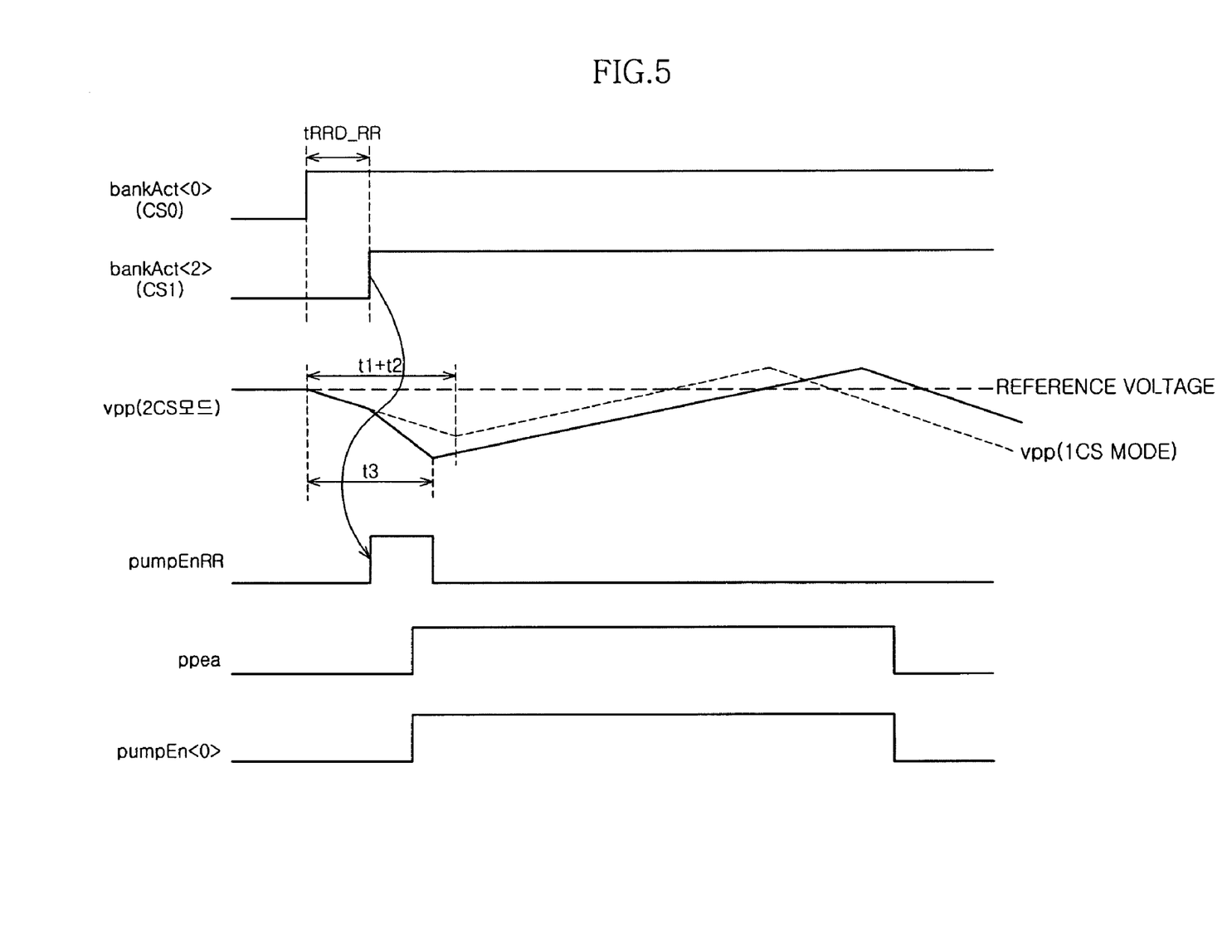
FIG. 5 is a timing diagram illustrating an exemplary operation of the apparatus of FIG. 4 according to one embodiment.

FIG. 5 is a timing diagram illustrating an exemplary operation of the apparatus of FIG. 4 according to one embodiment. According to enabling the bank active signal 'bankAct<0>' with respect to bank0, the pumping voltage vpp can be reduced and can become lower than the reference voltage vrefp or less. After a predetermined time has passed tRRD_RR, if the bank active signal 'bankAct<2>' with respect to bank2 is enabled, the second pumping enable signal 'pumpEnRR' can be enabled by the high speed pumping control unit 205.

Next, the actuation control unit 207 can actuate the pumping unit 209 by the second pumping enable signal 'pumpEnRR'. Then, after a time t3 that is required to boost the pressure, the pumping voltage vpp can be boosted.

In the 1CS mode, after the bank active signal 'bankAct<0>' is enabled with respect to the bank0, the pumping voltage vpp can be boosted after a time t1 that is required to detect the pumping voltage and a time t2 that is required in the voltage pumping. However, when the bank controlled by different CS signals is continuously actuated, the pumping unit 209 can be actuated regardless of the level of pumping voltage. For example, before the first pumping enable signal 'pumpEn<0>', which is generated by the pumping control signal 'ppea', is enabled, the second pumping enable signal 'pumpEnRR' can be enabled, and the pumping unit 209 can be actuated by detecting it in the actuation control unit 207.

Accordingly, since a time t1 that is required to detect the pumping voltage is unnecessary, the degree of reduction of the pumping voltage vpp is reduced. Thus, after a time t3< (t1+t2) that is required to boost the pressure, the pumping voltage vpp can be boosted.

Figure 6:
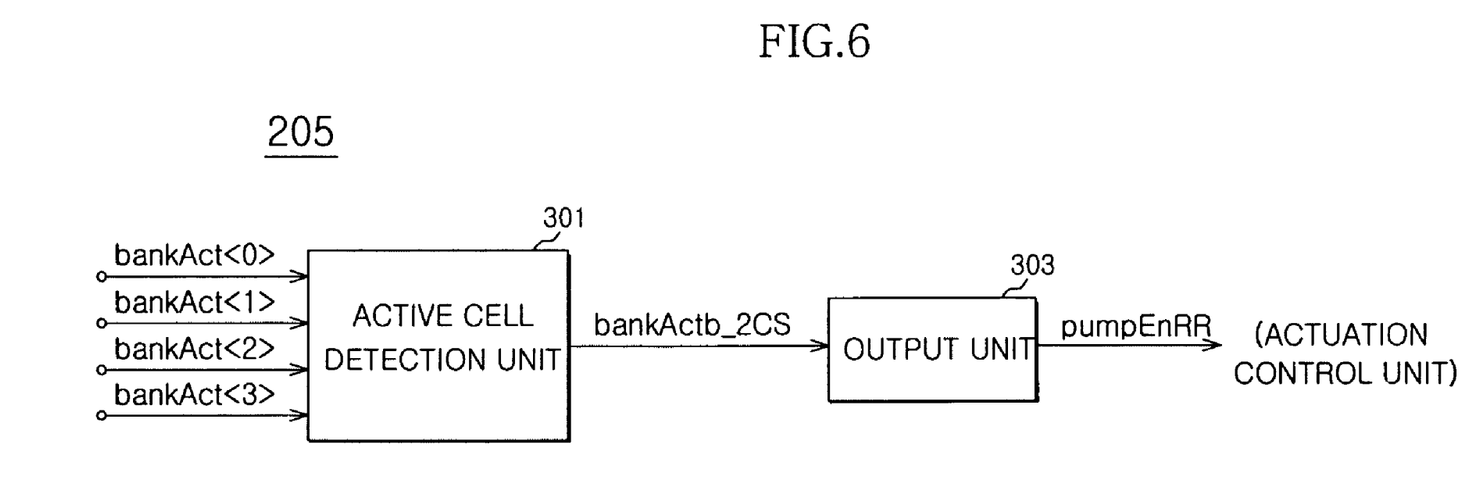
FIG. 6 is an schematic block diagram of an exemplary high speed pumping control unit capable of being implemented in the apparatus of FIG. 4 according to one embodiment.

FIG. 6 is a schematic block diagram of an exemplary high speed pumping control unit capable of being implemented in the apparatus of FIG. 4 according to one embodiment. In FIG. 6, when the bank operated by different CS signals is continuously actuated, in order to generate the pumping voltage at a high speed, the high speed pumping control unit 205 can include an active cell detection unit 301 and an output unit 303.

First, as the active cell detection unit 301, the bank active signal with respect to all banks, i.e., the bank active signals 'bankAct<0>' and 'bankAct<1>' with respect to bank0 and bank1 designated by the first cell operated by the CS0 signal, and bank active signals 'bankAct<2>' and 'bankAct<3>' with respect to bank2 and bank3 designated by the second cell operated by the CS1 signal, are inputted. Accordingly, when any one of bank active signals that is into the first cell and any one of bank active signals that is into the second cell are continuously enabled, that is, at least two banks that are controlled by different CS signals are continuously actuated, the active cell detection unit 301 can output the bank continuous active signal 'bankActb 2CS'.

In addition, the output unit 303 can output the second pumping enable signal 'pumpEnRR' by receiving the bank continuous active signal 'bankActb__2CS', and can provide it to the actuation control unit 207.

Figure 7:
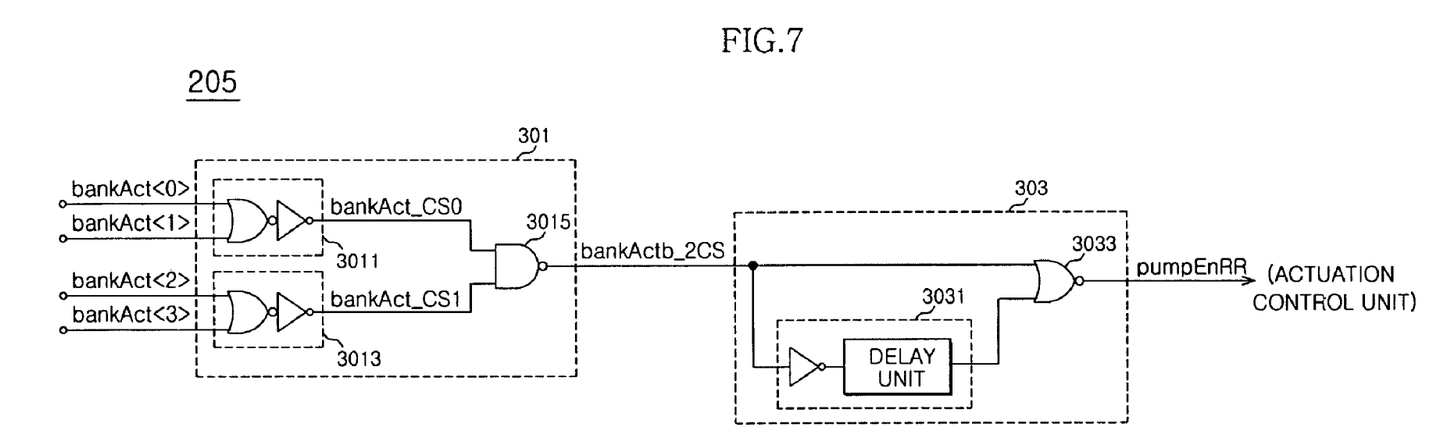
FIG. 7 is a schematic circuit diagram of the high speed pumping control unit of FIG. 6 according to one embodiment.

FIG. 7 is a schematic circuit diagram of the high speed pumping control unit of FIG. 6 according to one embodiment. In FIG. 7, the active cell detection unit 301 can include a first device 3011 that can receive the bank active signal 'bankAct<0>' or 'bankAct<1>' with respect to each bank designated in the first cell to output a first cell active signal 'bankAct_CS0' when any one bank active signal 'bankAct<0>' or 'bankAct<1>' is enabled. In addition, the active cell detection unit 301 can include a second device 3013 that can receive the bank active signal 'bankAct<2>' or 'bankAct<3>' with respect to each bank designated in the second cell to output a second cell active signal 'bankAct_CS1' when any one bank active signal 'bankAct<2>' or 'bankAct<3>' is enabled. Moreover, the active cell detection unit 301 can include a third device 3015 that can receive the output signal of a device 3011 and a second device 3013 to output a bank continuous active signal 'bankActb__2CS' when the bank operated by different CS signals is continuously actuated.

In addition, the output unit 303 can operate by using a pulse generator. The output unit 303, as shown in FIG. 7, is an example of a pulse generator, and can include a delay unit 3031 that can inversely delay the signal by receiving the bank continuous active signal 'bankActb__2CS' output from the active cell detection unit 301, and a fourth device 3033 that can output the second pumping enable signal 'pumpEnRR' according to the output signal of the bank continuous active signal 'bankActb__2CS' and the delay unit 3031.

In FIG. 7, the first device 3011 and the second device 3013 can be used by serially connecting a NOR gate and an inverter, and the third device 3015 can include a NAND gate. In addition, the delay unit 3031 can be used by serially connecting the inverter and a delay device, and the fourth device 3033 can include the NOR gate.

Figure 8:
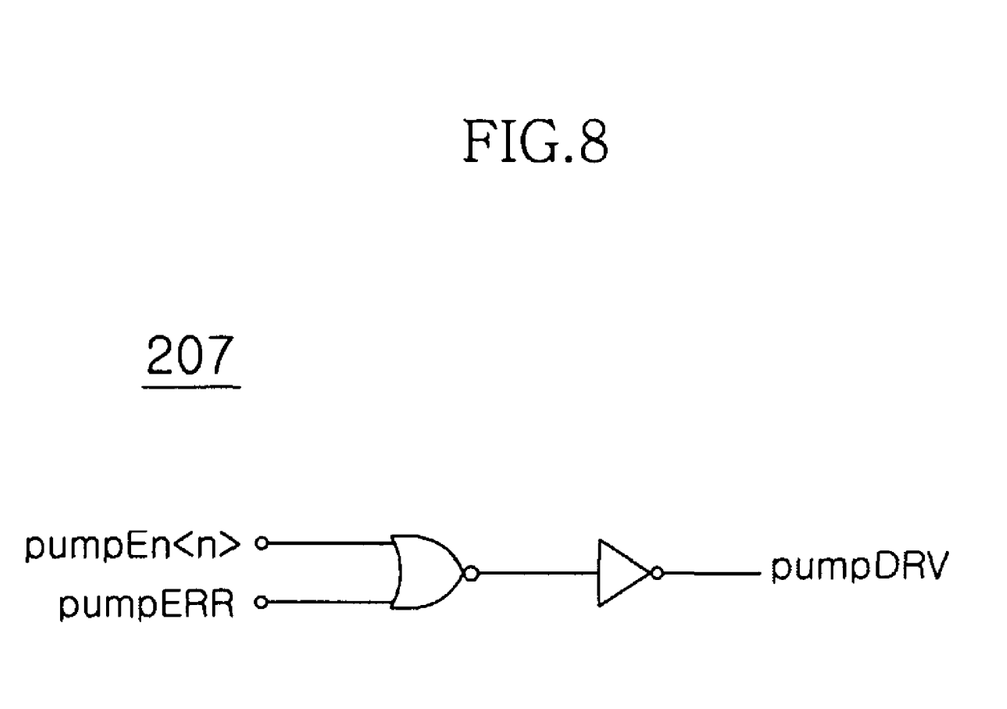
FIG. 8 is a general schematic circuit diagram of an exemplary actuation control unit capable of being implemented in the apparatus of FIG. 4 according to one embodiment.

FIG. 8 is a general schematic circuit diagram of an exemplary actuation control unit capable of being implemented in the apparatus of FIG. 4 according to one embodiment. In FIG. 8, the actuation control unit 207 can include a device that receives the first pumping enable signal 'pumpEn<n>' and the second pumping enable signal 'pumpEnRR', wherein any one of them can be enabled to output an actuation signal 'pumpDRV' for actuating the pumping unit 209. Alternatively, the actuation control unit 207 can be formed by serially connecting the NOR gate and the inverter.

In FIG. 7, the high speed pumping control unit 205 may reduce the time required for pumping by actuating the pumping unit without requiring a process for determining the level of pumping voltage after any one bank has been controlled by CS signal 'CS0', and any one bank controlled by CS signal 'CS1' is continuously enabled. However, when the bank controlled by CS signal 'CS0' is enabled and after a long period of time, i.e., the time that is required to detect the level of pumping voltage and boost the pressure, the bank controlled by CS signal 'CS1' can be enabled, wherein the voltage reduction of the pumping voltage is not significant. Thus, the high speed pumping control unit 205 can actuate the pumping unit when the level of pumping voltage is lower than the standard value, whereby unnecessary current consumption can be prevented.

In order to achieve this, when the enabling interval between the bank controlled by the CS signal 'CS0' and the bank controlled by CS signal 'CS1' is relatively long, the second pumping enable signal 'pumpEnRR' is not enabled, as will be described with reference to FIGS. 9 to 11 below.

Figure 9:
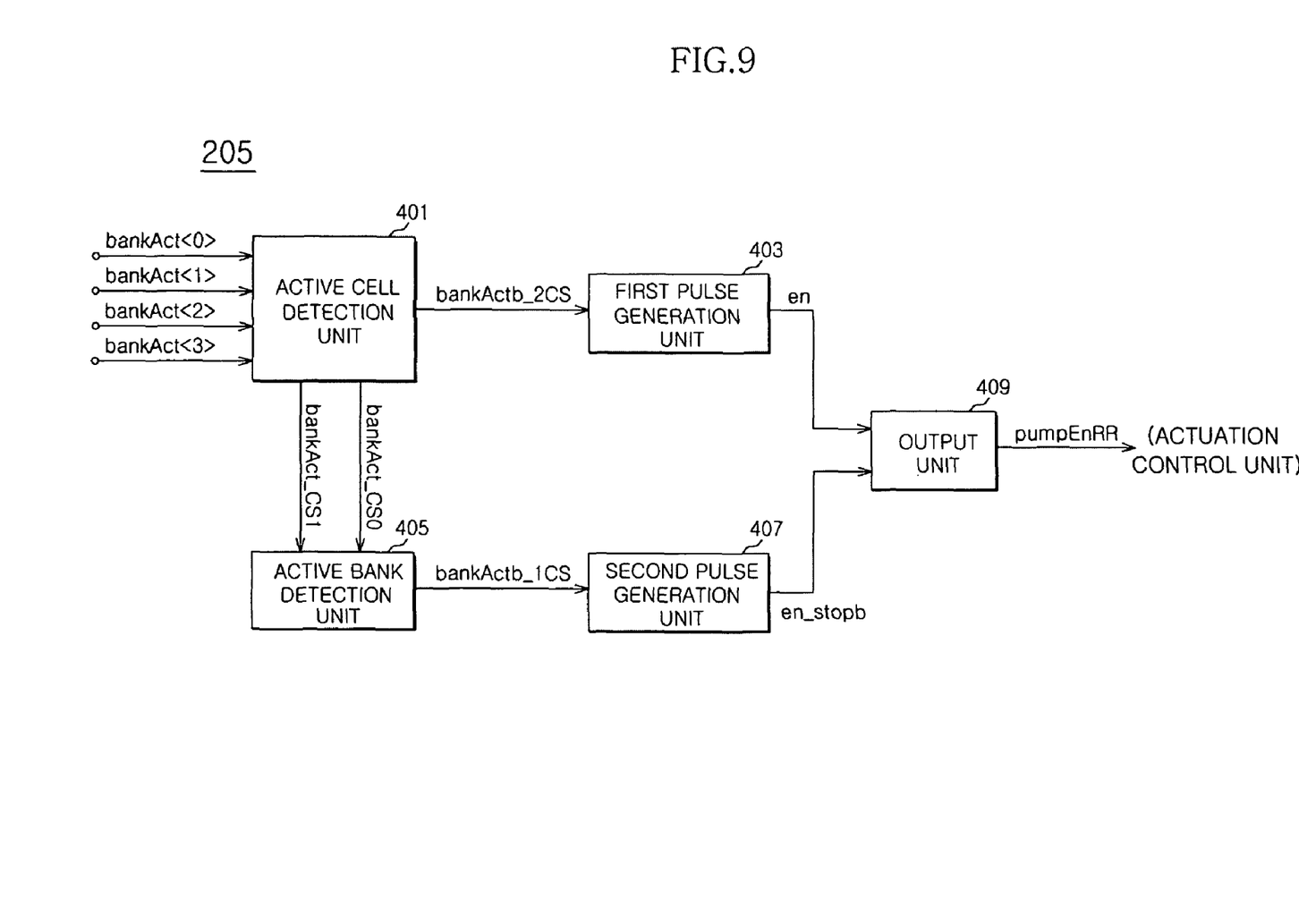
FIG. 9 is schematic block diagram of another exemplary high speed pumping control unit capable of being implemented in apparatus of FIG. 4 according to another embodiment.

FIG. 9 is schematic block diagram of another exemplary high speed pumping control unit capable of being implemented in apparatus of FIG. 4 according to another embodiment. In FIG. 9, the high speed pumping control unit 205 can be configured to include an active cell detection unit 401, a first pulse generation unit 403, an active bank detection unit 405, a second pulse generation unit 407 and an output unit 409.

In FIG. 9, the bank active signals 'bankAct<0>' and 'bankAct<1>' with respect to bank0 and bank1 designated by the first cell operated by the CS0 signal, and bank active signals 'bankAct<2>' and 'bankAct<3>' with respect to bank2 and bank3 designated by the second cell operated by the CS1 signal are input to the active cell detection unit 401. Accordingly, when the bank active signal with respect to any one bank active signal that is input into the first cell and any one bank that is input into the second cell can be continuously enabled. For example, when the bank operated by different CS signals is continuously actuated, the active cell detection unit 401 can output the enabled first bank continuous active signal 'bankActb__2CS'.

The first pulse generation unit 403 can output a first pulse 'en' that can be enabled according to the continuous actuation of the bank that can be actuated by different CS signals by receiving the first bank continuous active signal 'bankActb__2CS' from active cell detection unit 401.

In addition, when any one bank is activated by receiving the first cell active signal 'bankAct_CS0' generated when any one bank designated in the first cell is activated, and the second cell active signal 'bankAct_CS1' generated when any one bank designed in the second cell is activated from the active cell detection unit 401, the active bank detection unit 405 can output the second bank continuous active signal 'bankActb__1CS' that can be enabled according to the bank active signal of the previously actuated bank.

When any one bank is activated by receiving the second bank continuous active signal 'bankActb__1CS', the second pulse generation unit 407 can output an enabled second pulse 'en_stopb'. In addition, when the bank controlled by the other CS signal is continuously actuated within a predetermined time when the bank active signal is enabled to actuate the bank controlled by any one CS signal, the output unit 409 can output the second pumping enable signal 'pumpEnRR' for actuating the pumping unit 209, according to the output signals of the first and the second pulse generation units 403 and 407.

For example, the bank controlled by different CS signals in the active cell detection unit 401 is continuously actuated can be detected, and detection can be output to the first pulse 'en'. In addition, it can be detected whether any one bank is actuated in the active bank detection unit 405, and the detection can be output to the second pulse 'en_stopb'. In addition, in the output unit 409, if the second pulse 'en' is enabled while the second pulse 'en_stopb' is enabled, i.e., if the bank actuated by different CS signals is continuously actuated in a state that the bank active signal for actuating any one bank is enabled, the second pumping enable signal 'pumpEnRR' can be enabled. Conversely, in a state that the bank active signal for actuating any one bank is enabled and the second pulse 'en_stopb' is enabled, if it is not confirmed that the banks actuated by different CS signals are continuously actuated, i.e., if the first pulse 'en' is disabled, then the second pumping enable signal 'pumpEnRR' can be disabled. Accordingly, since the actuation control unit 207 can actuate the pumping unit 209 by the first pumping enable signal 'pumpEn<n>', unnecessary current consumption can be prevented.

Figure 10:
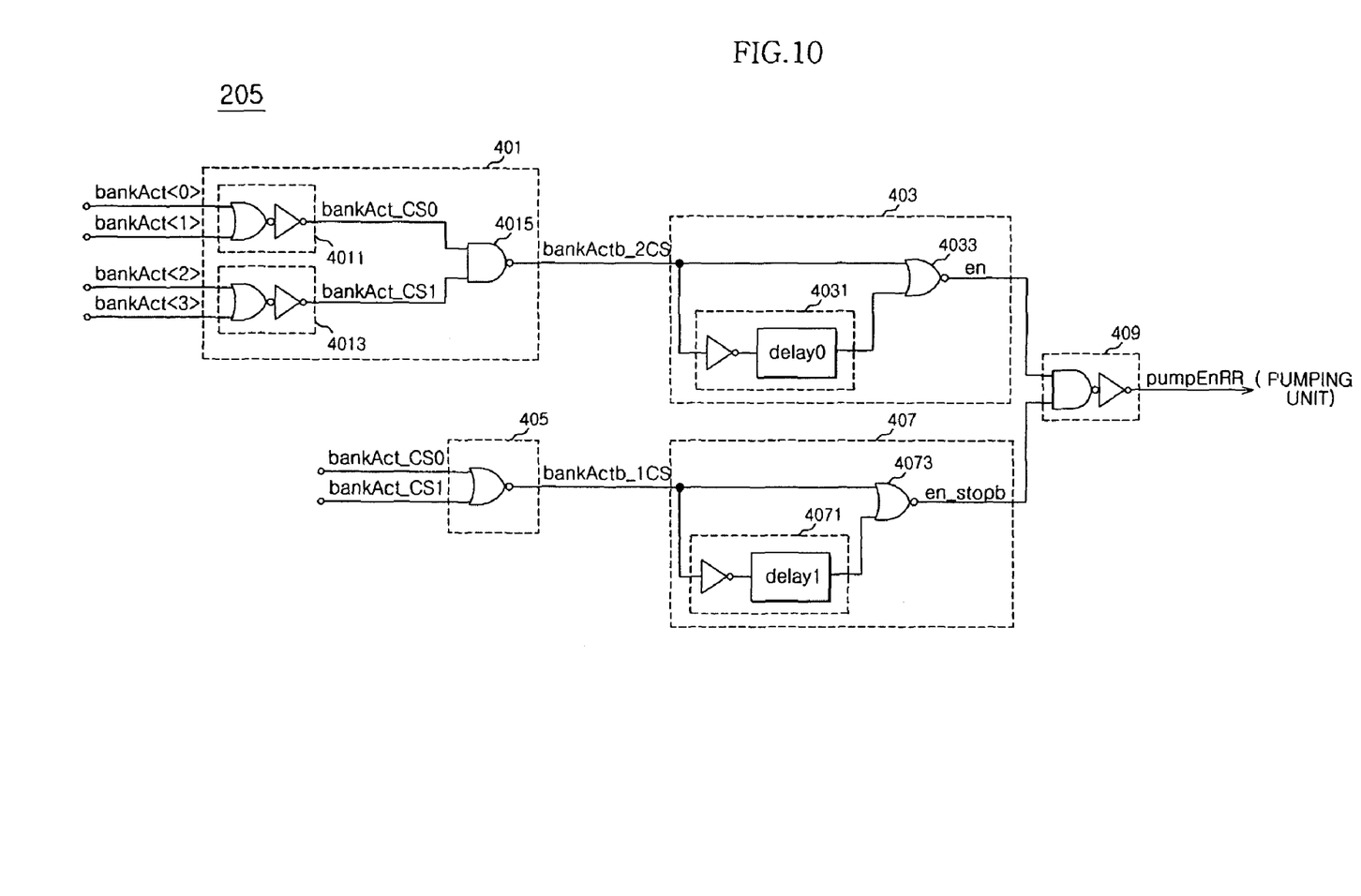
FIG. 10 is a schematic circuit diagram of the high speed pumping control unit of FIG. 9 according to one embodiment.

FIG. 10 is a schematic circuit diagram of the high speed pumping control unit of FIG. 9 according to one embodiment. In FIG. 10, the active cell detection unit 401 can include a first device 4011 that can receive the bank active signal 'bankAct<0>' or 'bankAct<1>' with respect to each bank designated in the first cell to output a first cell active signal 'bankAct_CS0' when any one bank active signal 'bankAct<0>' or 'bankAct<1>' is enabled. In addition, the active cell detection unit 401 can include a second device 4013 that can receive the bank active signal 'bankAct<2>' or 'bankAct<3>' with respect to each bank designed in the second cell to output a second cell active signal 'bankAct_CS1' when any one bank active signal 'bankAct<2>' or 'bankAct<3>' is enabled. Moreover, the active cell detection unit 401 can include a third device 4015 that can receive the output signal of a device 4011 and a second device 4013 to output a bank continuous active signal 'bankActb__2CS' when the bank operated by different CS signals is continuously actuated.

In addition, the first pulse generation unit 403 can include a first delay unit 4031 that can inversely delay the signal, and can output it by receiving the first bank continuous active signal 'bankActb__2CS' output from the active cell detection unit 401, and a fourth device 4033 that can output the first pulse signal 'en' according to the output signals of the first bank continuous active signal 'bankActb__2CS' and the first delay unit 4031.

In FIG. 10, the first device 4011 and the second device 4013 can be used by serially connecting the NOR gate and the inverter, and the third device 4015 can include the NAND gate. In addition, the first delay unit 4031 can be used by serially connecting the inverter and the delay device, and the fourth device 4033 can include the NOR gate.

When any one bank is enabled by receiving the first cell active signal bankAct_CS0 and the second cell active signal bankAct_CS1 from the active cell detection unit 401, the active bank detection unit 405 can include a device that can output the second bank continuous active signal 'bankActb__1CS'. In addition, the active bank detection unit 405 can include the NOR gate.

In FIG. 10, the second pulse generation unit 407 can include a second delay unit 4071 that can inversely delay the signal and output the signal by receiving the output signal of the active bank detection unit 405, and a fifth device 4073 that can output the second pulse signal 'en_stopb' according to the output signals of the second bank continuous active signal 'bankAct__1CS' and the delay unit 4071. Here, the second delay unit 4071 can be used by serially connecting the inverter and the delay device, and the fifth device 4073 may include the NOR gate.

The output unit 409 can include a device that can output the second pumping enable signal 'pumpEnRR' according to the first and the second pulse signals 'en' and 'en_stopb' that can be output from the first and second pulse generation unit 403 and 407. For example, the output unit 409 can be used by serially connecting the NAND gate and the inverter.

In FIG. 10, when the bank active signal with respect to the bank actuated by different CS signals is continuously enabled, the first bank continuous active signal 'bankActb__2CS' that is output from the active cell detection unit 401 can be enabled at a low level. In addition, the first pulse generation unit 403 can generate the first bank continuous active signal 'bankActb__2CS' to the first pulse signal 'en'.

When any one bank active signal is enabled, the second bank continuous active signal 'bankActb__1CS' that is output from the active bank detection unit 405 can be enabled at a low level regardless of the CS signal. In addition, the second pulse generation unit 407 can generate the second bank continuous active signal 'bankActb__1CS' to the second pulse signal 'en_stopb'.

Accordingly, when the first pulse signal 'en' is enabled while the second pulse signal 'en_stopb' is enabled, i.e., the bank active signal with respect to the two banks actuated by different CS signals is continuously enabled while any one bank active signal is enabled, the output unit 409 can enable the second pumping enable signal 'pumpEnRR'. Conversely, when the bank active signal with respect to two banks actuated by different CS signals is not continuously enabled while any one bank active signal is enabled, the second pumping enable signal 'pumpEnRR' can be disabled.

Figure 11:
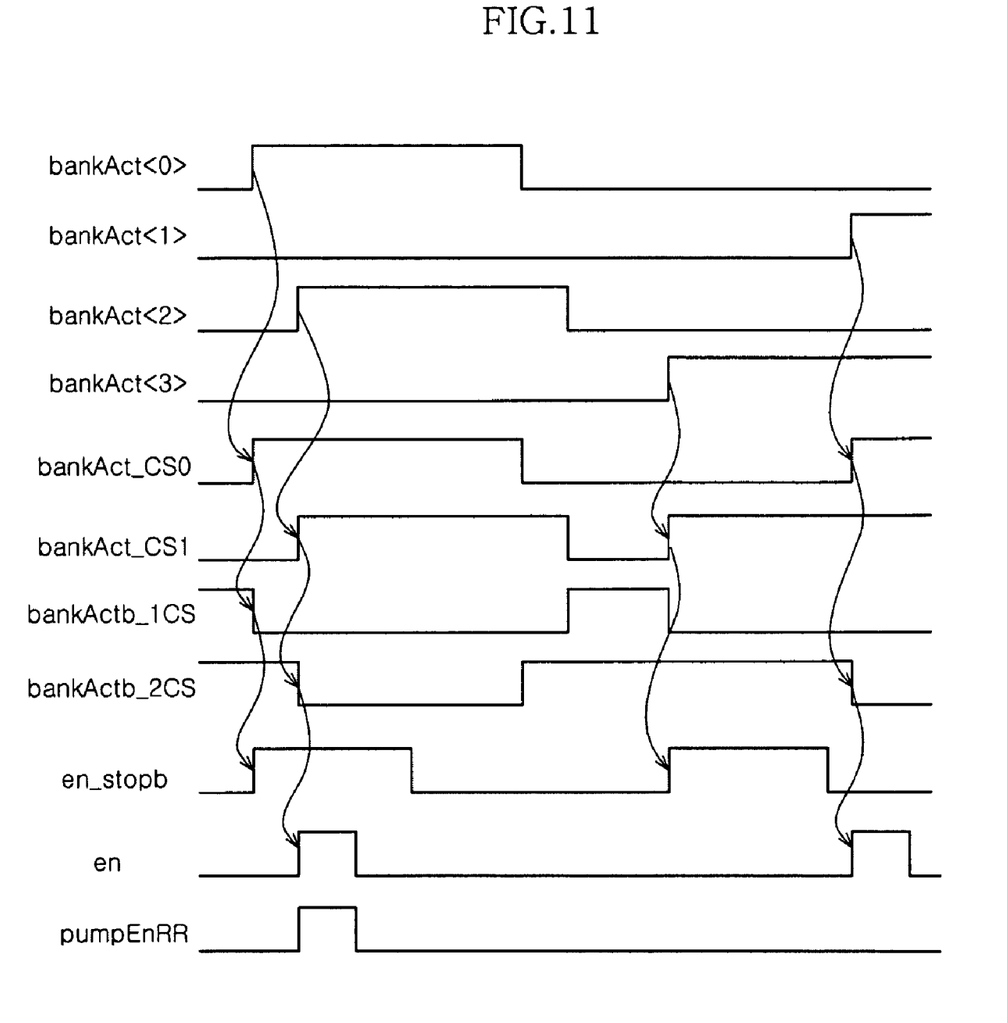
FIG. 11 is a timing diagram illustrating an exemplary operation of the high speed pumping control unit of FIG. 10 according to one embodiment.

FIG. 11 is a timing diagram illustrating an exemplary operation of the high speed pumping control unit of FIG. 10 according to one embodiment. In FIG. 11, the first cell active signal 'bankAct_CS0' and the second cell active signal 'bankAct_CS1' can be sequentially enabled according to the enabling of the bank active signal 'bankAct<0>' with respect to the bank0 and the enabling of the bank active signal 'bankAct<2>' with respect to the bank2, When at least one of the first and the second cell active signals 'bankAct_CS0' and 'bankAct_CS1' is enabled, the second bank continuous active signal 'bankActb__1CS' can be low-enabled and the second pulse signal 'en_stopb' can be output. When the first and the second cell active signals 'bankAct_CS0' and 'bankAct_CS1' are enabled, the first bank continuous active signal 'bankActb__2CS' can be low-enabled and the second pulse signal 'en' can be output.

In addition, if the first pulse signal 'en' is enabled within an area where the second pulse signal 'en_stopb' is enabled, then the second pumping enable signal 'pumpEnRR' can be enabled to initiate the pumping operation. When the bank active signal 'bankAct<3>' with respect to bank3 is enabled and the bank active signal 'bankAct<1>' with respect to bank1 is enabled after a long period of time, the second pumping enable signal 'pumpEnRR' can be disabled. For example, according to the enabling of the bank active signal 'bankAct<3>' with respect to bank3, the second bank continuous active signal 'bankActb__1CS' can be enabled at a low level, and at this time, the second pulse signal 'en_stopb' can be output.

Conversely, after the bank active signal 'bankAct<3>' with respect to bank3 is enabled, when the bank active signal 'bankAct<1>' with respect to enabled bank1 is enabled after a predetermined period of time, the first bank continuous active signal 'bankActb__2CS' can be enabled at a low level. Accordingly, the first pulse signal 'en' can be enabled when the bank active signal 'bankAct<1>' with respect to bank1 is enabled. As a result, after the second pulse signal 'en_stopb' is disabled, since the first pulse signal 'en' is enabled, the second pumping enable signal 'pumpEnRR' that is output from the output unit 409 can be disabled.

Thus, since the actuation control unit 207 can actuate the pumping unit 209 by the first pumping enable signal 'pumpEn<n>', when bank3 and bank1 are actuated at a long interval, since unnecessary voltage pumping does not occur, unnecessary current consumption may be prevented.

After the bank controlled by any one CS signal is enabled and the bank controlled by the other CS signal is continuously enabled after a predetermined time, i.e., time when the second pulse signal 'en_stopb' is enabled, the high speed pumping control unit 205 can prevent high speed pumping, thus preventing unnecessary consumption of current.

According to the apparatus for generating pumping voltage, in a 2CS mode DRAM device, when a bank actuated by different CS signals is continuously actuated for a short time, pumping voltage may be boosted at a high speed. Thus, the degree of reduction of the pumping voltage may be reduced and precise data may be recorded.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. An apparatus for generating pumping voltage of a multiple Chip Select (CS) mode semiconductor memory apparatus, comprising:
    a high speed pumping control unit configured to produce a pumping enable signal regardless of the level of a pumping voltage to actuate the pumping unit when a plurality of banks of the semiconductor apparatus operated by different CS signals are continuously actuated,
    wherein the high speed pumping control unit includes:
        an active cell detection unit configured to receive the bank active signal in order to actuate the one bank controlled by different CS signals to output a bank continuous active signal when the one bank that is controlled by different CS signals is continuously actuated; and
        an output unit configured to output a second pumping enable signal according to the bank continuous active signal.

2. The apparatus for generating pumping voltage of claim 1, wherein the apparatus for generating pumping voltage includes:
    a pumping voltage detection unit configured to receive the pumping voltage and a reference voltage to enable a pumping control signal, and to output the pumping control signal when the pumping voltage is lower than the reference voltage;
    a pumping enable signal generation unit configured to receive the pumping control signal and a bank active signal with respect to a specific one of the plurality of banks to output a first pumping enable signal when the specific one bank is actuated;
    a high speed pumping control unit configured to receive the bank active signal with respect to the plurality of banks to output a second pumping enable signal when one of the plurality of banks that is operated by different CS signals is continuously actuated;
    an actuation control unit configured to output a pumping actuation signal when any one of the first pumping enable signal and the second pumping enable signal is enabled; and
    a pumping unit configured to pump voltage to output the pumping voltage according to enabling of the pumping actuation signal.

3. The apparatus for generating pumping voltage of claim 1, wherein the active cell detection unit includes:
    a first device configured to output a first cell active signal when one of the plurality of banks controlled by any one CS signal is activated;
    a second device configured to output a second cell active signal when one of the plurality of banks controlled by the other CS signal is activated; and
    a third device configured to generate a bank continuous active signal and to provide the bank continuous active signal to the output unit according to enabling of the first cell active signal and the second cell active signal.

4. The apparatus for generating pumping voltage of claim 1, wherein the output unit includes:
    a delay unit configured to inversely delay the bank continuous active signal; and
    a fourth device configured to output a second pumping enable signal according to an output signal of the bank continuous active signal and the delay unit.

5. The apparatus for generating pumping voltage of claim 2, wherein the semiconductor memory apparatus includes a plurality of apparatuses, each configured to generate a pumping voltage.

6. The apparatus for generating pumping voltage of claim 5, wherein the high speed pumping control unit and the actuation control unit are provided in one of the plurality of apparatuses for generating the pumping voltage.

7. An apparatus for generating pumping voltage of a multiple Chip Select (CS) mode semiconductor memory apparatus, comprising:
    a high speed pumping control unit configured to actuate a pumping unit by enabling a pumping enable signal regardless of the level of pumping voltage to actuate the pumping unit when a plurality of banks of the semiconductor memory apparatus actuated by different CS signals are continuously actuated within a predetermined time and to disable the pumping enable signal when the plurality of banks actuated by different CS signals are delayed for a predetermined time or more and continuously actuated,
    wherein the high speed pumping control unit includes:
        an active cell detection unit configured to receive the bank active signal which is actuated by different CS signals and configured to output an enabled first bank continuous active signal when the at least two banks that is controlled by different CS signals is continuously actuated;
        an active bank detection unit configured to output a second bank continuous active signal when any one of the banks controlled by different CS signals are actuated; and
        an output unit configured to output a second pumping enable signal when the first bank continuous active signal is enabled while the second bank continuous active signal is enabled.

8. The apparatus for generating pumping voltage of claim 7, further comprising:
    a pumping voltage detection unit configured to receive the pumping voltage and a reference voltage to enable a pumping control signal and to output the pumping control signal when the pumping voltage is lower than the reference voltage;
    a pumping enable signal generation unit configured to receive the pumping control signal and a bank active signal with respect to a specific one of the plurality of banks to output a first pumping enable signal when the specific one bank is actuated;
    a high speed pumping control unit configured to receive the bank active signal with respect to the plurality of banks to enable a second pumping enable signal when one of the plurality of banks operated by different CS signals is continuously actuated within a predetermined time, and to disable the pumping enable signal when the one bank that is actuated by different CS signals is delayed and continuously actuated for a predetermined time or more;

an actuation control unit configured to output a pumping actuation signal when one of the first pumping enable signal and the second pumping enable signal is enabled; and a pumping unit configured to pump voltage to output the pumping voltage according to enabling of the pumping actuation signal.

9. The apparatus for generating pumping voltage of claim 7, wherein the high speed pumping control unit further includes:

a first pulse generation unit configured to output a first pulse according to the first bank continuous active signal; and a second pulse generation unit configured to output a second pulse according to the second bank continuous active signal;

wherein the output unit is configured to output the second pumping enable signal when the first pulse is enabled while the second pulse is enabled by receiving the first pulse and the second pulse.

10. The apparatus for generating pumping voltage of claim 9, wherein the active cell detection unit includes:

a first device configured to output a first cell active signal when the one bank controlled by any one CS signal is activated;

a second device configured to output a second cell active signal when the one bank controlled by the other CS signal is activated; and a third device configured to generate a first bank continuous active signal and to provide the first bank continuous active signal to the first pulse generation unit according to the output signal of the first device and the second device.

11. The apparatus for generating pumping voltage of claim 9, wherein the first pulse generation unit includes:

a first delay unit configured to inversely delay the first bank continuous active signal; and a fourth device configured to generate a first pulse according to an output signal of the first bank continuous active signal and the first delay unit.

12. The apparatus for generating pumping voltage of claim 9, wherein the second pulse generation unit includes:

a second delay unit configured to inversely delay the second bank continuous active signal; and a fifth device configured to output a second pulse according to an output signal of the second bank continuous active signal and the delay unit.

13. The apparatus for generating pumping voltage of claim 8, wherein the semiconductor memory apparatus includes a plurality of apparatuses, each for generating a pumping voltage.

14. The apparatus for generating pumping voltage of claim 13, wherein the high speed pumping control unit and the actuation control unit are provided in any one of the plurality of apparatuses for generating the pumping voltage.

* * * * *